United States Patent
Yi (10) Patent No.: US 11,227,760 B2
(45) Date of Patent: Jan. 18, 2022

(54) WAFER THINNING METHOD AND WAFER STRUCTURE

(71) Applicant: Wuhan Xinxin Semiconductor Manufacturing Co., Ltd., Hubei (CN)

(72) Inventor: Hongsheng Yi, Hubei (CN)

(73) Assignee: Wuhan Xinxin Semiconductor Manufacturing Co., Ltd., Wuhan (CN)

( * ) Notice: Subject to any disclaimer, the term of this patent is extended or adjusted under 35 U.S.C. 154(b) by 182 days.

(21) Appl. No.: 16/584,513

(22) Filed: Sep. 26, 2019

(65) Prior Publication Data
US 2021/0035793 A1 Feb. 4, 2021

(30) Foreign Application Priority Data

Jul. 29, 2019 (CN) .......................... 201910690423.3

(51) Int. Cl.
| H01L 21/02 | (2006.01) |
| B24B 7/22 | (2006.01) |
| H01L 21/687 | (2006.01) |
| H01L 21/66 | (2006.01) |

(52) U.S. Cl.
CPC ........ H01L 21/02013 (2013.01); B24B 7/228 (2013.01); H01L 21/02016 (2013.01); H01L 21/68742 (2013.01); H01L 22/26 (2013.01)

(58) Field of Classification Search
CPC ............... B24B 7/228; H01L 21/02002; H01L 21/02013; H01L 21/02016; H01L 21/68742; H01L 21/762; H01L 22/26
USPC .......................................... 257/618; 438/459
See application file for complete search history.

(56) References Cited

U.S. PATENT DOCUMENTS

| 9,685,333 | B2 | 6/2017 | Nakajima et al. |
| 2004/0106358 | A1* | 6/2004 | Tsao ...................... B24B 37/042 |
| | | | 451/8 |
| 2016/0126150 | A1* | 5/2016 | Goldberg ................ H01L 22/12 |
| | | | 438/8 |
| 2016/0155640 | A1 | 6/2016 | Nakajima et al. |
| 2018/0369862 | A1* | 12/2018 | Alie ...................... B81B 3/0021 |
| 2019/0134774 | A1 | 5/2019 | Yagi et al. |

FOREIGN PATENT DOCUMENTS

| CN | 105453228 A | 3/2016 |
| CN | 105500184 A | 4/2016 |
| CN | 109659221 A | 4/2019 |
| JP | 2018142717 A | 9/2018 |

OTHER PUBLICATIONS

First Chinese Office Action regarding Application No. 201910690423.3 dated Mar. 16, 2021. English translation provided by Unitalen Attorneys at Law.

* cited by examiner

*Primary Examiner* — Long K Tran
(74) *Attorney, Agent, or Firm* — Harness, Dickey & Pierce, P.L.C.

(57) ABSTRACT

A wafer thinning method and a wafer structure are provided. In the wafer thinning method, a to-be-thinned wafer is provided, and the to-be-thinned wafer is grinded on a rear surface of the to-be-thinned wafer. Then, a first planarization process is performed on a rear surface of the grinded wafer to restore surface flatness of the grinded wafer, and a second planarization process is performed on a rear surface of the wafer obtained after the first planarization process is performed until a target thinned thickness is reached.

13 Claims, 4 Drawing Sheets

WAFER THINNING METHOD AND WAFER STRUCTURE

CROSS REFERENCE TO RELATED APPLICATION

The present application claims priority to Chinese Patent Application No. 201910690423.3, titled "WAFER THINNING METHOD AND WAFER STRUCTURE", filed on Jul. 29, 2019 with the Chinese Patent Office, which is incorporated herein by reference in its entirety.

FIELD

The present disclosure relates to the field of semiconductor devices and manufacture technology thereof, and in particular to a wafer thinning method and a wafer structure.

BACKGROUND

With the development of the semiconductor technology, the three-dimensional integrated circuit (3D-IC) technology is widely used due to high performance, low cost, and high integration. In the 3D-IC technology, different wafers are stacked and bonded to each other by using the wafer-level packaging technology.

In the wafer-level packaging technology, after the wafers are bonded to each other, a wafer is thinned on a rear surface of the wafer. In order to obtain a flat surface after the thinning process, an epitaxy (EPI) wafer, i.e., a wafer having an epitaxial layer grown on a silicon substrate, is generally used. The epitaxial layer serves as an acid-etching stop layer in the thinning process, so that a flat silicon surface can be obtained. However, the EPI wafer is expensive. Further, lateral undercutting of the wafer may be caused in the acid etching process. In this case, the wafer is required to be trimmed, reducing an effective chip area.

SUMMARY

In view of this, a wafer thinning method and a wafer structure are provided in the present disclosure, to reduce the number of trimming processes and increase an effective chip area.

The following technical solutions are provided in the present disclosure.

The wafer thinning method provided in the present disclosure includes:
providing a to-be-thinned wafer;
grinding the to-be-thinned wafer on a rear surface of the to-be-thinned wafer;
performing a first planarization process on a rear surface of the grinded wafer to restore surface flatness of the grinded wafer; and
performing a second planarization process on a rear surface of the wafer obtained after the first planarization process is performed until a target thinned thickness is reached.

In an embodiment, each of the first planarization process and the second planarization process is a chemical-mechanical planarization process.

In an embodiment, the to-be-thinned wafer is a silicon wafer.

In an embodiment, the to-be-thinned wafer is bonded to another wafer.

In an embodiment, an error of the surface flatness of the grinded wafer is less than 0.5 μm.

In an embodiment, the grinding is controlled by performing the following processes including:
controlling a grinder to grind the to-be-thinned wafer with a set grinding parameter;
controlling the grinder to grind a test wafer with the set grinding parameter in a case that monitoring of the test wafer is required to be initiated; and
acquiring an updated grinding parameter as the set grinding parameter and returning to the controlling the grinder to grind the to-be-thinned wafer with the updated grinding parameter, where the updated grinding parameter is determined based on a first total thickness variation of the test wafer after being grinded, and the first total thickness variation of the test wafer is obtained by using a dedicated measuring device.

In an embodiment, determining the updated grinding parameter includes:
determining the updated grinding parameter based on the first total thickness variation of the test wafer from experimental data that is obtained in advance, where the experimental data includes a correspondence between first total thickness variations of the test wafer after being grinded and grinding parameters.

In an embodiment, whether the monitoring of the test wafer is required to be initiated is determined by:
determining whether the number of the to-be-thinned wafer reaches a mass production cycle, where in a case that the number of the to-be-thinned wafer reaches the mass production cycle, it is determined that the monitoring of the test wafer is required to be initiated.

In an embodiment, the grinder is provided with a thickness measuring device, and the controlling a grinder to grind the to-be-thinned wafer with a set grinding parameter further includes: acquiring, by using the thickness measuring device, a second total thickness variation of the to-be-thinned wafer after being grinded. Whether the monitoring of the test wafer is required to be initiated is determined based on the second total thickness variation of the to-be-thinned wafer.

In an embodiment, a supporting stage of the grinder is provided with a first fixed point, a second lifting point and a third lifting point, and the grinding parameter includes displacement parameters of the second lifting point and the third lifting point.

The wafer structure provided in the present disclosure includes a first wafer and a second wafer that are boned to each other. The first wafer remains intact. The second wafer has been thinned by the wafer thinning method described above.

A wafer thinning method and a wafer structure are provided in the present disclosure. In the wafer thinning method, a to-be-thinned wafer is provided, and the to-be-thinned wafer is grinded on a rear surface of the to-be-thinned wafer. Then, a first planarization process is performed on a rear surface of the grinded wafer to restore surface flatness of the grinded wafer, and a second planarization process is performed on a rear surface of the wafer obtained after the first planarization process is performed until a target thinned thickness is reached. With the wafer thinning method, after a part of a thickness of the wafer is removed, the flatness of the wafer is restored by two planarization processes without growing an epitaxial layer as an etching stop layer, reducing the cost. Further, most of the thickness of the wafer is removed by a grinding process rather than an acid etching process, avoiding lateral undercutting caused due to the acid etching process, thereby reducing the number of trimming processes for eliminating the lateral undercutting, and thus increasing the effective chip area.

BRIEF DESCRIPTION OF THE DRAWINGS

In order to more clearly illustrate technical solutions in embodiments of the present disclosure or in the conventional technology, the drawings to be used in the description of the embodiments or the conventional technology are briefly described below. Apparently, the drawings in the following description only show some embodiments of the present disclosure, and other drawings may be obtained by those skilled in the art from the drawings without any creative work.

DETAILED DESCRIPTION OF EMBODIMENTS

In order to make the above objects, features and advantages of the present disclosure more apparent and easier to be understood, embodiments of the present disclosure are illustrated in detail in conjunction with the drawings hereinafter.

Specific details are described in the following description, so that the present disclosure can be fully understood. The present disclosure may be implemented in other manners than those described herein, and those skilled in the art can make modifications without departing from the scope of the present disclosure. Therefore, the present disclosure is not limited to the specific embodiments described below.

In addition, the present disclosure is described in detail in conjunction with the drawings. In the detailed description of the present disclosure, a sectional view showing a device structure may be partially enlarged with a non-normal scale, and is only exemplary, which does not limit the protection scope of the present disclosure. Moreover, three-dimensional sizes including a length, a width and a depth should be considered during actual fabricating.

Figure 1:
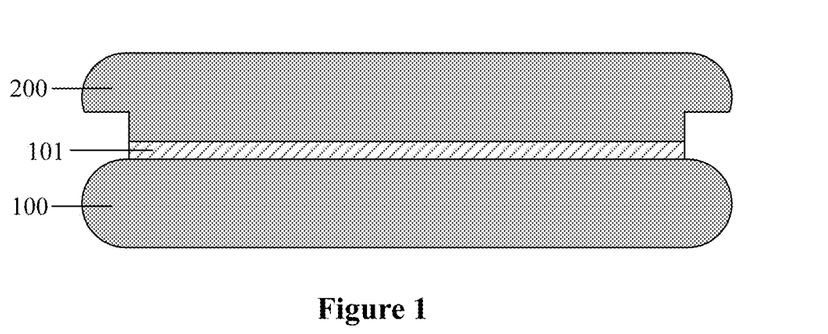
FIG. 1 is a schematic structural diagram of a to-be-thinned wafer according to an embodiment of the present disclosure.

As described in the background, a wafer may be thinned on a rear surface of the wafer after the wafer is bonded to another wafer, to remove a port of a substrate of the wafer, so as to reduce a total thickness of the wafers. Reference is made to FIG. 1, which is a schematic structural diagram of a to-be-thinned wafer according to an embodiment of the present disclosure. As shown in FIG. 1, a front surface of a first wafer 100 is bonded to a front surface of a second wafer 200 by a bonding layer 101, and a wafer stack is formed. An edge of the second wafer 200 is trimmed, and the second wafer 200 may be considered as a to-be-thinned wafer.

Figure 2:
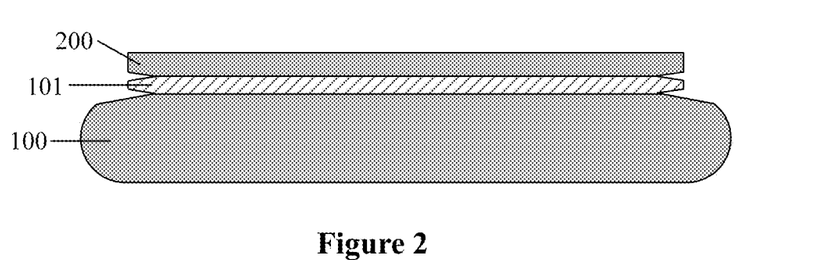
FIG. 2 and FIG. 3 are schematic structural diagrams of a wafer after being thinned in the conventional technology.

In order to obtain a flat surface after a thinning process, an epitaxial layer may be grown on a silicon substrate. In the thinning process, the substrate material is removed with the epitaxial layer as an acid-etching stop layer, and the flat epitaxial layer is obtained as a silicon surface located at a rear surface side of the wafer. However, the wafer formed with the epitaxial layer is expensive. Further, lateral undercutting of the wafer is caused due to the removing of the substrate material by an acid etching process, which results in damage to a part of a material layer at an edge between the wafers, and even affects bonding quality between the wafers at the edge. Reference is made to FIG. 2, which is a schematic structural diagram of a wafer after being thinned in the conventional technology. As shown in FIG. 2, lateral undercutting exists at an edge between a first wafer 100 and a bonding layer 101, and the lateral undercutting also exists at an edge between a second wafer 200 and the bonding layer 101. In this case, a gap is formed between the wafers that are bonded to each other, reducing the bonding quality between the wafers.

Figure 3:
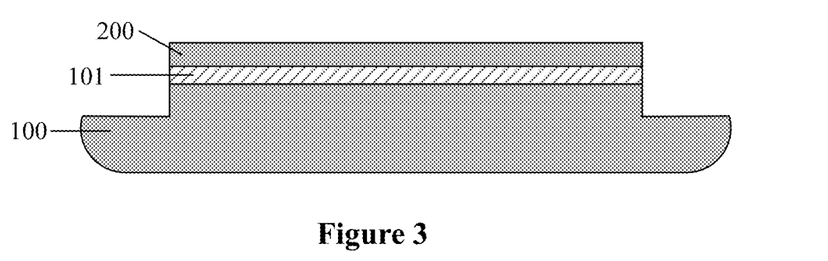

The wafer may be trimmed to eliminate the undercutting. Reference is made to FIG. 3, which is a schematic structural diagram of a wafer after being thinned in the conventional technology. As shown in FIG. 3, an undercut portion of the wafer at the edge is removed, avoiding degradation in the bonding quality between the wafers, while reducing an effective chip area. With the increasing number of thinning processes, an area of the trimmed wafer is increased, and the effective chip area of the wafer is decreased.

Based on the above, a wafer thinning method is provided according to an embodiment of the present disclosure. In the wafer thinning method, a to-be-thinned wafer is provided, and the to-be-thinned wafer is grinded on a rear surface of the to-be-thinned wafer. Then, a first planarization process is performed on a rear surface of the grinded wafer to restore surface flatness of the grinded wafer, and a second planarization process is performed on a rear surface of the wafer obtained after the first planarization process is performed until a target thinned thickness is reached. With the wafer thinning method according to the embodiment of the present disclosure, after a part of a thickness of the wafer is removed, the flatness of the wafer is restored by two planarization processes without growing an epitaxial layer as an etching stop layer, reducing the cost. Further, most of the thickness of the wafer is removed by a grinding process rather than an acid etching process, avoiding the lateral undercutting caused due to the acid etching process, thereby reducing the number of trimming processes for eliminating the lateral undercutting, and thus increasing the effective chip area.

In order to better understand technical solutions and technical effects of the present disclosure, the following embodiments are described below in detail in conjunction with the drawings.

Figure 4:
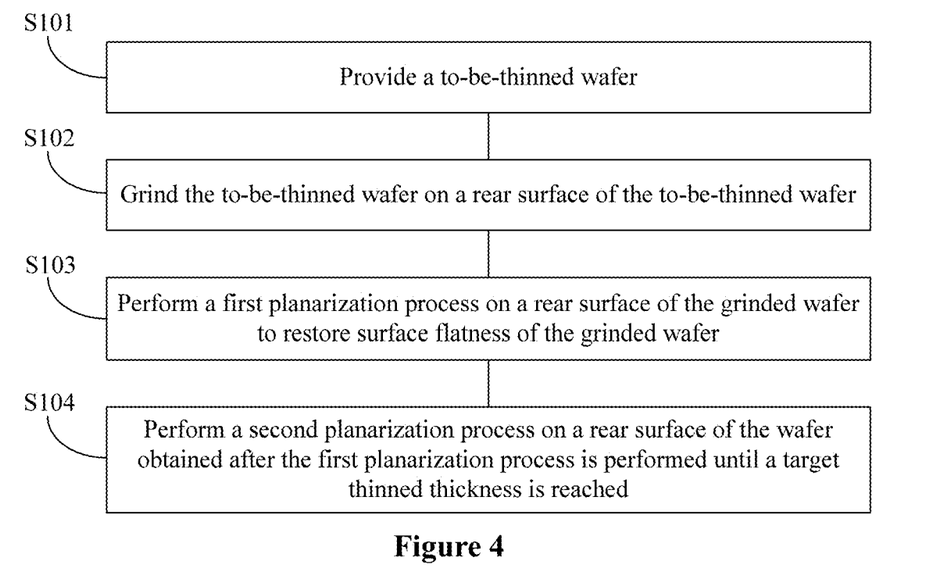
FIG. 4 is a flowchart of a wafer thinning method according to an embodiment of the present disclosure.

Reference is made to FIG. 4, which is a flowchart of a wafer thinning method according to an embodiment of the present disclosure. The method includes the following steps S101 to S104.

In S101, a to-be-thinned wafer is provided, as shown in FIG. 1.

In the embodiment of the present disclosure, the to-be-thinned wafer is a wafer by which the total thickness is reduced. The to-be-thinned wafer may be a single wafer that is required to be thinned, or may be an upper wafer in a wafer stack formed by multiple wafers bonded to each other.

The upper wafer may be referred to as a second wafer. For example, the to-be-thinned wafer may be bonded to a first wafer 100 on an underlayer to form a wafer stack, and the to-be-thinned wafer is required to be thinned to reduce the total thickness of the wafer stack. Referring to FIG. 1, the second wafer 200 may be considered as the to-be-thinned wafer.

In a case that the to-be-thinned wafer is an upper wafer in a wafer stack formed by multiple wafers bonded to each other, the to-be-thinned wafer may be trimmed, and thus the uneven portion at the edge of the upper wafer can be removed, ensuring the flatness of the edge of the upper wafer, improving the bonding strength of the upper wafer with another wafer, and avoiding crack caused by the gap at the edge.

Each of the to-be-thinned wafer 200 and the first wafer 100 may include a substrate, a device structure formed on the substrate, and an interconnect layer for electrically connecting the device structure. The device structure may be covered by a dielectric layer, and the interconnect layer is formed in the dielectric layer. The substrate of the to-be-thinned wafer 200 is implemented by a semiconductor substrate, which may be, for example, a Si substrate, a Ge substrate, a SiGe substrate, a Silicon On Insulator (SOI) substrate or a Germanium On Insulator (GOI) substrate. In other embodiments, the substrate may be implemented by a substrate including other elementary semiconductors or compound semiconductors, such as GaAs, InP, or SiC. The substrate may also be implemented by a stack structure, such as Si/SiGe, and the substrate may also be implemented by other epitaxial structures such as Germanium Silicon On Insulator (SGOI). In the embodiment of the present disclosure, the substrate of the to-be-thinned wafer 200 is a silicon substrate, and the to-be-thinned wafer 200 is a silicon wafer.

The device structure may be a metal oxide semiconductor (MOS) device, a storage device, a sensor device and/or other passive devices. The storage device may include a nonvolatile memory or a random access memory. The nonvolatile memory may include, for example, a ferroelectric memory, a phase change memory, or a floating gate field effect transistor such as a NOR flash memory or a NAND flash memory. The device structure may be a planar device or a stereoscopic device. The stereoscopic device may be, for example, a fin field effect transistor (FIN-FET), or a three-dimensional memory. The interconnect layer may be provided with a contact plug, a via hole, a metal layer, and the like. The interconnect layer may have one or more layers. The interconnect layer may be made of a metal material such as tungsten, aluminum, or copper.

Figure 5:
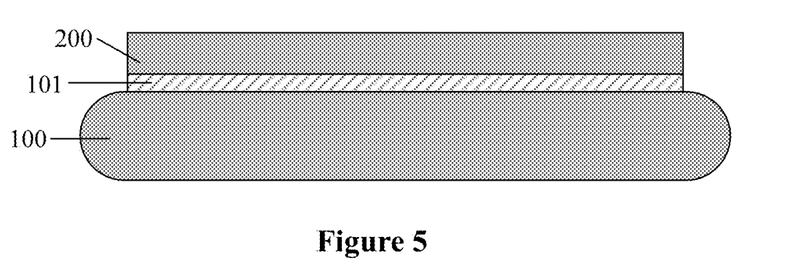
FIG. 5 and FIG. 6 are schematic structural diagrams of a wafer after being thinned according to an embodiment of the present disclosure.

In S102, the to-be-thinned wafer 200 is grinded on a rear surface of the to-be-thinned wafer 200, as shown in FIG. 5.

Since the device structure is formed on the front surface of the to-be-thinned wafer 200, the wafer 200 may be grinded on the rear surface of the wafer 200 to reduce the thickness of the to-be-thinned wafer 200. Generally, the thickness of the wafer is reduced rapidly by a grinding process. Therefore, for a wafer that is required to be thinned by a target thinned thickness, most of the target thinned thickness may be removed by the grinding process. For example, for the wafer 200, the target thinned thickness may be about 99% of the total thickness of the wafer 200, and generally 98.2% to 99.6%, and the thickness that may be removed by the grinding process may be about 98% of the total thickness of the wafer 200. In an exemplary scenario, the total thickness of the wafer is 775 μm, and the thickness of the wafer may be reduced to 10 μm to 15 μm by the grinding process, that is, the wafer is thinned by 98% to 98.7% of the total thickness of the wafer.

In the embodiment of the present disclosure, after the wafer is grinded, a planarization process is performed to restore the surface flatness of the wafer, and another planarization process is further performed on the flat surface to reach the target thinned thickness. In specific applications, the grinding process may be controlled to obtain a small error of the surface flatness of the grinded wafer, so as to improve the efficiency of the subsequent planarization process and reduce the manufacturing cost. Specifically, the grinding process may be controlled so that the error of the surface flatness of the grinded wafer is small, for example, equal to or less than 0.5 μm.

In a specific implementation, a grinder may be controlled to grind the wafer 200. A grinding parameter of the grinder may be controlled so that the error of the surface flatness of the grinded wafer 200 can be small, thereby obtaining a wafer having a flat surface. The process of controlling the grinding is described later.

In S103, a first planarization process is performed on a rear surface of the grinded wafer 200 to restore surface flatness of the grinded wafer 200.

Figure 6:
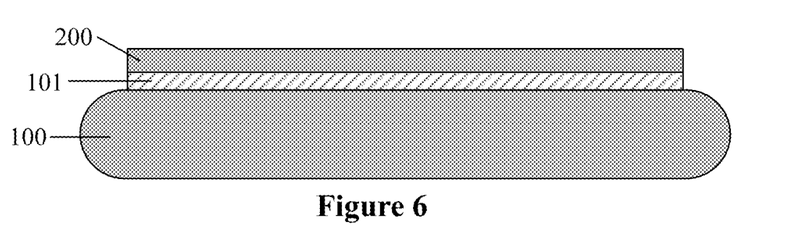

In S104, a second planarization process is performed on a rear surface of the wafer 200 obtained after the first planarization process is performed until a target thinned thickness is reached, as shown in FIG. 6.

After the wafer 200 is grinded on the rear surface, an error of the surface flatness of the grinded wafer 200 is small. In this case, the first planarization process may be performed directly on the rear surface of the wafer 200, to restore the surface flatness of the grinded wafer 200, so as to obtain a relatively flat surface.

The first planarization process may be a chemical-mechanical planarization process. Specifically, the wafer 200 may be immersed in a grinding liquid. The grinding liquid may be an acidic solution or an alkaline solution, and the grinding liquid may contain suspended abrasive particles, an oxidizing agent, an activating agent, and the like. The first planarization process may be controlled by a first process parameter, and the surface flatness of the grinded wafer may be restored by one or more stages of process control. Process parameters in the stages may be the same or different. The first process parameter may include: a content of the oxidizing agent, a content of the activating agent, a particle size and a content of the suspended abrasive particles, a roughness and a rotational speed of a grinding head of the grinder, and a force applied to the grinding head.

Since the first planarization process is performed to restore the surface of the grinded wafer 200, the thickness removed by this process may be small. In this process, a high region on the surface of the wafer 200 is predominantly removed, to reduce the error of the surface flatness of the wafer 200. Therefore, by adjusting the process parameter of the first planarization process, a function of restoring the flatness can be achieved, so that the error of the surface flatness of the wafer can be restored, and thus obtains a relatively flat surface. In specific applications, for example, pressures of the grinding head for different regions may be set in the grinding process, where a value of the pressure may be determined based on the TTV of the wafer. Specifically, a large pressure may be set for a region having a large thickness, and a small pressure may be set for a region having a small thickness, to reduce a thickness difference between adjacent regions. In a specific implementation, the flatness error is reduced by about 0.2 μm.

After the first planarization process is performed on the rear surface of the wafer 200, a wafer having a relatively high surface flatness may be obtained. Next, the second planarization process is performed on the rear surface of the wafer 200 until the target thinned thickness is reached, which does not significantly affect the surface flatness of the wafer. That is, after the second planarization process is performed, the rear surface of the formed wafer 200 has a relatively high flatness, and the total thickness of the wafer 200 reaches a required thickness.

The second planarization process may be a chemical-mechanical planarization process. Specifically, the wafer 200 may be immersed in a grinding liquid. The grinding liquid in the second planarization process may be an acidic solution or an alkaline solution, and the grinding liquid may contain suspended abrasive particles, an oxidizing agent, an activating agent, or the like, which is similar to the first planarization process. The second planarization process may be controlled by a second process parameter, and the target thinned thickness may be reached by one or more stages of process control. Process parameters in the stages may be the same or different. The second process parameter may include: a content of the oxidizing agent, a content of the activating agent, a particle size and a content of the suspended abrasive particles, a roughness and a rotational speed of a grinding head of the grinder, and a force applied to the grinding head.

Since the second planarization process is performed to reduce the thickness of the wafer, the process parameter of the second planarization process may be adjusted for the flat surface obtained after the first planarization process is performed. The second planarization process is performed with the second process parameter to thin the wafer continuously on the premise of ensuring the surface flatness of the wafer, until a target thinned thickness is reached. Some or all of the second process parameters may be different from the first process parameters to provide a fast thinning rate for the second planarization process. In specific applications, for example, the content of the oxidizing agent, the content of the activating agent, the particle size and the content of the suspended particles, the rotational speed and the roughness of the grinding head, or the force applied on the grinding head may be increased. The thinning rate of the second planarization process is lower than the thinning rate of the grinding process, and the obtained surface flatness of the wafer is also superior to the surface flatness obtained by the grinding process. In this way, a wafer having relatively high flatness can be obtained.

After the first planarization process and the second planarization process are performed, the thickness of the wafer is further reduced, where a sum of thicknesses thinned by the first planarization process and the second planarization process may be 0.2% to 1.6% of the total thickness of the wafer. In an exemplary scenario, the total thickness of the wafer is 775 μm, and the thickness of the wafer may be reduced to about 3 μm by the grinding process and the two planarization processes.

With the wafer thinning method according to the embodiment of the present disclosure, after a part of a thickness of the wafer is removed, the flatness of the wafer is restored by two planarization processes without growing an epitaxial layer as an etching stop layer, reducing the cost. Further, most of the thickness of the wafer is removed by a grinding process rather than an acid etching process, avoiding the lateral undercutting caused due to the acid etching process, thereby reducing the number of trimming processes for eliminating the lateral undercutting, and thus increasing the effective area of the wafer. In this way, even if multiple wafers in a wafer stack are thinned in the wafer packaging process, the effective area of the wafer stack can not be greatly reduced.

Figure 7:
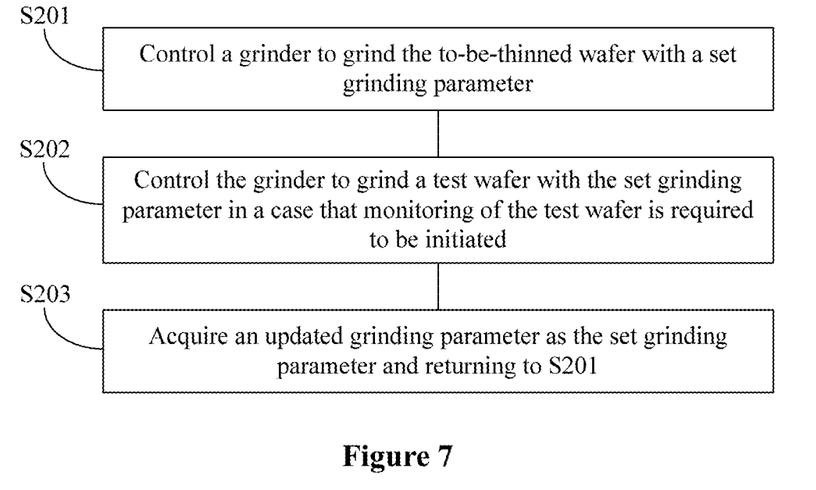
FIG. 7 is a flowchart showing a grinding control process according to an embodiment of the present disclosure.

In the embodiment of the present disclosure, after the wafer 200 is grinded on the rear surface, the relatively flat wafer 200 may be obtained, and then the two planarization processes are performed. The grinding process by which an error of the surface flatness of the wafer is small is described below. Reference is made to FIG. 7, which shows a grinding control process according to an embodiment of the present disclosure. As shown in FIG. 7, the grinding control process includes the following steps S201 to S203.

In S201, a grinder is controlled to grind the to-be-thinned wafer 200 with a set grinding parameter.

Figure 8:
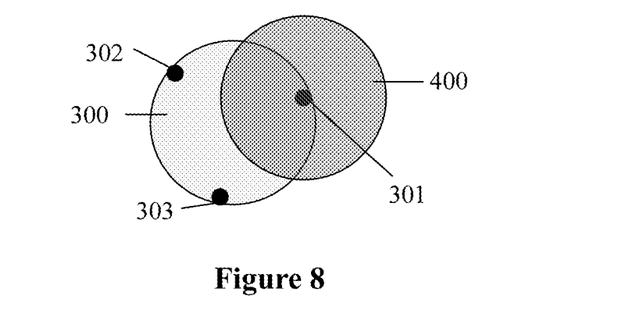
FIG. 8 and FIG. 9 are respectively a top view and a front view of a grinder according to an embodiment of the present disclosure.
Figure 9:
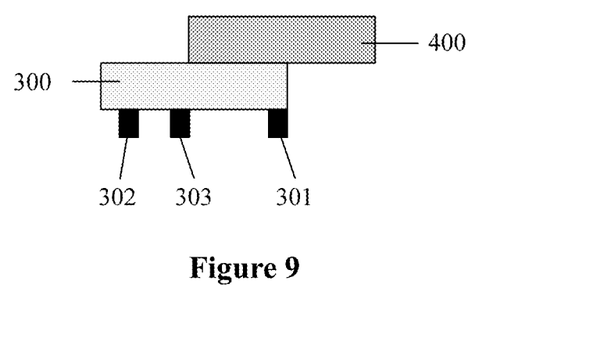

Reference is made to FIG. 8 and FIG. 9, which are respectively a top view and a front view of a grinder according to an embodiment of the present disclosure. The grinder may include a supporting stage 300 and a grinding head 400. The wafer 200 may be placed on the supporting stage 300, so as to be grinded. The surface to be grinded of the wafer 200 may be placed upwards. The grinding head 400 is controlled to contact with the upper surface of the wafer 200 and rub against the upper surface of the wafer 200, to destroy the structure of the upper surface of the wafer 200 and remove a part of the thickness of the wafer 200, so as to thin the wafer 200.

Specifically, the supporting stage 300 may be provided with a first fixed point 301, a second lifting point 302, and a third lifting point 303. A position of the first fixed point 301 is fixed, and positions of the second lifting point 302 and the third lifting point 303 may be adjusted up and down. By adjusting heights of the second lifting point 302 and the third lifting point 303, a local height of the supporting stage may be adjusted. In practice, the height of the second lifting point 302 may be adjusted by controlling a D motor, and the height of the third lifting table 303 may be adjusted by controlling an S motor.

In some possible embodiments, the grinder may be provided with a thickness measuring device. After the to-be-thinned wafer 200 is grinded, the thickness of the grinded wafer 200 may be measured by the thickness measuring device, to obtain a second total thickness variation (TTV) of the to-be-thinned wafer 200. The second TTV may include a difference between the maximum thickness and the minimum thickness of the wafer 200. The large difference corresponds to the low flatness of the wafer 200. The second TTV may also include thickness information of the wafer 200 at various positions, to reflect morphology of the grinded wafer 200 at the various positions.

In the embodiment of the present disclosure, the grinding parameter may include displacement parameters of the second lifting point 302 and the third lifting point 303. The local height of the supporting stage 300 may be set by setting the displacement parameters of the second lifting point 302 and the third lifting point 303, to set a relative position between different regions of the upper surface of the wafer on the supporting stage 300 and the grinding head 400, and further set the grinding rate for the upper surface of the wafer. The displacement parameters of the second lifting point 302 and the third lifting point 303 may be respectively position parameters of the second lifting point 302 and the third lifting point 303 with respect to the first fixed point 301.

Specifically, by adjusting the second lifting point 302, a height difference between the edge and the center position of the wafer may be adjusted, that is, the "V" morphology of the wafer is adjusted. It is shown by multiple tests that, the thickness of the wafer at the center position is gradually increased with respect to the edge as the second lifting point 302 is gradually lowered. Specifically, by adjusting the third lifting point 303, the height of a region between the edge and the center position of the wafer may be adjusted, that is, the "M" morphology of the wafer is adjusted. It is shown by multiple tests that, the thickness of the region between the edge and the center position of the wafer is gradually decreased as the third lifting point 303 is gradually raised.

In the embodiment of the present disclosure, the set grinding parameter may be a preferred grinding parameter that is calculated in advance according to test classification. For example, the grinding parameter may be set by the grinder based on the second TTV, or may be initially set artificially. The grinder is controlled to grind the to-be-thinned wafer 200 with the set grinding parameter. The set grinding parameter may include the set displacement parameters of the second lifting point 302 and the third lifting point 303. For example, the height difference between the second lifting point 302 and the first fixed point 301 may be set as $h_1$, and the height difference between the third lifting point 303 and the first fixed point 301 may be set as $h_2$.

In S202, in a case that monitoring of a test wafer is required to be initiated, the grinder is controlled to grind the test wafer with the set grinding parameter.

In the embodiment of the present disclosure, the test wafer is a wafer for testing performance of the grinder. In the process that the to-be-thinned wafer 200 is grinded, it may be determined whether the monitoring of the test wafer is required to be initiated, so as to adjust the set grinding parameter base on the monitoring result. If it is determined that the monitoring of the test wafer is not required to be initiated, the to-be-thinned wafer 200 is continuously grinded with the set grinding parameter. If it is determined that the monitoring of the test wafer is required to be initiated, the grinder may be controlled to grind the test wafer with the set grinding parameter.

Determining whether the monitoring of the test wafer is required to be initiated actually is determining whether the set grinding parameter is required to be adjusted. In this case, the determination may be made based on the number of to-be-thinned wafers 200 that have been grinded and flatness parameters of the to-be-thinned wafers 200 that have been grinded. This is because that, the grinding parameter may have a certain offset and the grinding parameter is required to be adjusted after a large number of to-be-thinned wafers 200 are grinded, or the grinding parameter is also required to be adjusted if the flatness parameters of the to-be-thinned wafers 200 that have been grinded do not meet requirements.

Specifically, it may be determined whether the number of to-be-thinned wafers reaches a mass production cycle. In a case that the number of to-be-thinned wafers reaches the mass production cycle, it is determined that the monitoring of the test wafer is required to be initiated. The mass production cycle herein indicates a cycle of adjusting the grinding parameter, which may be represented by the number of to-be-thinned wafers 200 that have been grinded. For example, the mass production cycle may be 500. In this case, the grinding parameter may be adjusted once for the grinding of every 500 to-be-thinned wafers 200, and it is determined that the monitoring of the test wafer is required to be initiated.

Specifically, whether the monitoring of the test wafer is required to be initiated may be determined further based on the second TTV of the to-be-thinned wafer after being grinded that is obtained by using the thickness measuring device. If the second TTV of the to-be-thinned wafer 200 does not meet requirements, the monitoring of the test wafer is required to be initiated so as to adjust the grinding parameter.

In a specific implementation, whether the monitoring of the test wafer is required to be initiated may be determined based on an offset between the second TTV of the to-be-thinned wafer 200 and a preset thickness deviation. If the offset is too large, it is indicated that the flatness of the to-be-thinned wafer 200 is poor, and in this case the monitoring of the test wafer may be initiated. In another specific implementation, whether the monitoring of the test wafer is required to be initiated may also be determined by determining whether the second TTV of the to-be-thinned wafer 200 is in a preset thickness deviation threshold range. If the second TTV is not in the preset thickness deviation threshold range, it is indicated that the flatness of the to-be-thinned wafer 200 is poor, and in this case the monitoring of the test wafer may be initiated.

In a case that the monitoring of the test wafer is required to be initiated, it is indicated that the set grinding parameter is required to be adjusted, and in this case the grinder may be controlled to grind the test wafer with the set grinding parameter to obtain a grinded test wafer. Theoretically, the flatness of the test wafer obtained after being grinded with the set grinding parameter is substantially the same as the flatness of the to-be-thinned wafer obtained after being grinded with the set grinding parameter. Therefore, the grinder can be monitored by the grinded test wafer.

In S203, an updated grinding parameter is acquired as the set grinding parameter, and the grinding control process returns to step S201.

Figure 10:
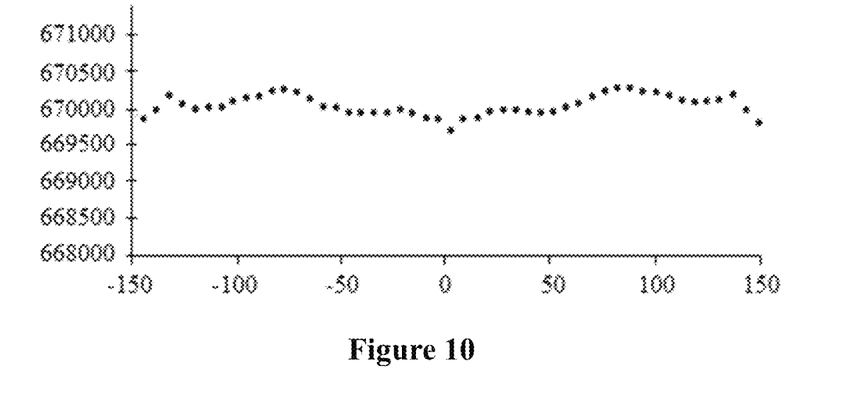
FIG. 10 is a schematic diagram showing a first total thickness variation (TTV) according to an embodiment of the present disclosure.

After the test wafer is grinded with the set grinding parameter, a first TTV of the test wafer may be obtained by using a dedicated measuring device. The first TTV may include thickness information of the test wafer at various positions, to reflect the morphology of the grinded test wafer at the various positions. Reference is made to FIG. 10, which is a schematic diagram showing a first TTV according to an embodiment of the present disclosure, where an abscissa indicates different positions of a to-be-thinned wafer in units of millimeter (mm), and an ordinate indicates a thickness of the to-be-thinned wafer in units of nanometer (nm). It should be noted that the dedicated measuring device has higher measurement accuracy than the thickness measuring device, and thus the obtained first TTV is more accurate than the second TTV.

The updated grinding parameter may be determined based on the first TTV of the test wafer from experimental data that is obtained in advance. The experimental data includes a correspondence between first TTVs of the grinded wafer obtained by using the dedicated measuring device and grinding parameters. In this way, a grinding parameter corresponding to the first TTV of the test wafer may be determined based on the first TTV, as the updated grinding parameter.

The experimental data may be obtained experimentally in advance. Specifically, the grinder may be controlled to grind the test wafer in advance with the first grinding parameter, and the grinded test wafer has a first historical TTV. According to the influence of the grinding parameter on the thickness of the grinded wafer at different positions, a second grinding parameter may be determined for the first historical TTV to overcome factors causing unevenness in the test wafer. The grinder is controlled to grind the test wafer with the second grinding parameter, and the grinded test wafer has a second historical TTV. The test wafer having the second historical TTV has better flatness than the test wafer having the first historical TTV, thus the correspondence between the second historical TTVs and the second grinding parameters may be used as the experimental data.

If the first historical TTV is the same as the second historical TTV, the second grinding parameter may be used as the updated grinding parameter. Since the experimental data is a correspondence between relatively flat TTVs and grinding parameters obtained in advance, the grinded wafer has a high flatness after the wafer is grinded with the grinding parameter corresponding to the relatively flat TTV.

In a specific implementation, since the height difference between the edge and the center position of the wafer may be adjusted by adjusting the second lifting point 302, and the height of the region between the edge and the center position of the wafer may be adjusted by adjusting the third lifting point 303, the displacement parameters of the second lifting point 302 and the third lifting point may be determined based on the height of the wafer at the edge, the height of the wafer at the center position, and the height of the region between the edge and the center position in the first historical TTV, to overcome the factors causing the unevenness in the wafer. For example, for the first TTV shown in FIG. 10, the third lifting point 303 may be raised, and the displacement parameter of the third lifting point 303 is determined based on the correspondence that is obtained experimentally, to accurately reduce the thickness of the region between the edge and the center position of the wafer, so as to improve the flatness of the test wafer.

Based on the first TTV of the grinded test wafer, the updated grinding parameter may be determined. The updated grinding parameters may be determined for the thickness defects in the first TTV. Since the first TTV is obtained by using the dedicated measuring device which has high measurement accuracy, the determined updated grinding parameters are also relatively accurate. In addition, the first TTV is the thickness information of the grinded test wafer, and the grinding parameter used for the grinding of the test wafer is the set grinding parameter, thus the first TTV is related to the set grinding parameter. In this case, the updated grinding parameter determined based on the first TTV is determined for the set grinding parameter, so that the set grinding parameter can be adjusted during the actual grinding process.

That is, the updated grinding parameter is a relatively accurate grinding parameter determined for the set grinding parameter. By controlling the grinder to grind the to-be-thinned wafer 200 with the updated grinding parameter, a relatively smooth grinded surface can be obtained. Therefore, the updated grinding parameter may be used as the set grinding parameter, and the grinding control process returns to S01. The grinder is controlled to continuously grind the to-be-thinned wafer 200 with the updated grinding parameter. The set grinding parameter may be adjusted again in a case that the monitoring of the test wafer is again required to be initiated.

Figure 11:
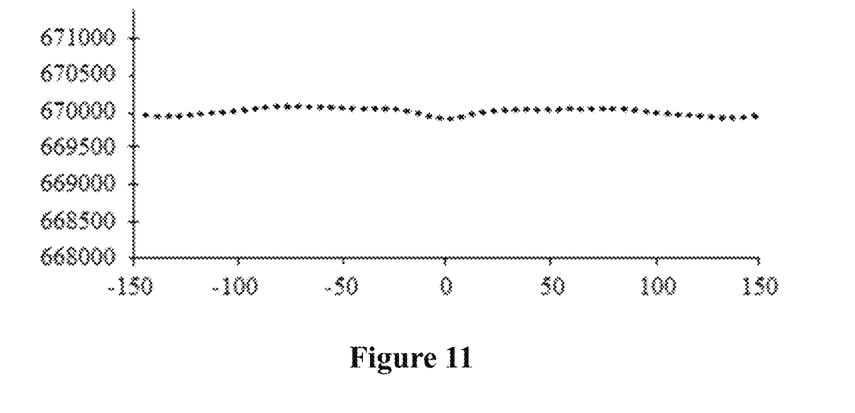
FIG. 11 is a schematic diagram showing a third TTV according to an embodiment of the present disclosure.

Reference is made to FIG. 11, which is a schematic diagram showing a third TTV of a to-be-thinned wafer after being grinded with an updated grinding parameter according to an embodiment of the present disclosure. The flatness error of the grinded wafer may reach 0.5 μm or less, where an abscissa indicates different positions of the to-be-thinned wafer in units of mm, and an ordinate indicates the thickness of the to-be-thinned wafer in units of nm. It can be seen that, a high flatness can be obtained by the grinding control process.

In addition, a wafer structure that is formed by the wafer thinning method described above is further provided in the present disclosure. Referring to FIG. 6, the wafer structure includes a first wafer 100 and a second wafer 200 located on the first wafer 100. The first wafer 100 and the second wafer 200 are bonded to each other. The first wafer 100 remains intact, and the second wafer 200 has been thinned.

The first wafer 100 and the second wafer 200 may be bonded to each other by a bonding layer (which is not shown). The bonding layer may be a single bonding layer made of a dielectric material, or may be a mixed bonding layer including a dielectric material and bonding holes.

The first wafer 100 may be considered as an underlayer wafer in the bonding process, and the second wafer 200 may be considered as a to-be-thinned wafer on the underlayer wafer. The to-be-thinned wafer is thinned by the thinning method described above, so that no erosion is laterally caused to the wafer structure. Therefore, after the second wafer 200 is thinned, the first wafer 100 on the underlayer is not required to be trimmed, but remains intact wafer morphology. That is, the wafer remains intact at the edge and in the thickness direction without being trimmed. In this way, the effective chip area can be greatly increased.

Further, the second wafer 200 may be trimmed, and the edge of the second wafer 200 is not intact. The trimmed second wafer 200 has a fine bonding interface with the first wafer 100, increasing the bonding strength with the first wafer.

The above embodiments are only preferred embodiments of the present disclosure. The preferred embodiments according to the present disclosure are disclosed above, but are not intended to limit the present disclosure. With the method and technical content disclosed above, those skilled in the art can make some variations and improvements to the technical solutions of the present disclosure, or make some equivalent variations on the embodiments without departing from the scope of technical solutions of the present disclosure. All simple modifications, equivalent variations and improvements made to the above embodiments based on the technical essence of the present disclosure without departing the content of the technical solutions of the present disclosure fall within the protection scope of the technical solutions of the present disclosure.

The invention claimed is:

1. A wafer thinning method, comprising:
providing a to-be-thinned wafer;
grinding the to-be-thinned wafer on a rear surface of the to-be-thinned wafer;
performing a first planarization process on a rear surface of the grinded wafer to restore surface flatness of the grinded wafer; and
performing a second planarization process on a rear surface of the wafer that is obtained after the first planarization process is performed until a target thinned thickness is reached;
wherein a thinning rate of the second planarization process Is faster than a thinning rate of the first planarization process, and is lower than a thinning rate of the grinding.

2. The method according to claim 1, wherein each of the first planarization process and the second planarization process is a chemical-mechanical planarization process.

3. The method according to claim 1, wherein the to-be-thinned wafer is a silicon wafer.

4. The method according to claim 1, wherein the to-be-thinned wafer is bonded to another wafer.

5. The method according to claim 1, wherein an error of the surface flatness of the grinded wafer is less than 0.5 µm.

6. The method according to claim 2, wherein an error of the surface flatness of the grinded wafer is less than 0.5 µm.

7. The method according to claim 3, wherein an error of the surface flatness of the grinded wafer is less than 0.5 µm.

8. The method according to claim 4, wherein an error of the surface flatness of the grinded wafer is less than 0.5 µm.

9. The method according to claim 1, wherein the grinding is controlled by performing the following processes comprising:

controlling a grinder to grind the to-be-thinned wafer with a set grinding parameter;

controlling the grinder to grind a test wafer with the set grinding parameter in a case that monitoring of the test wafer is required to be initiated; and acquiring an updated grinding parameter as the set grinding parameter and returning to the controlling the grinder to grind the to-be-thinned wafer with the updated grinding parameter, wherein the updated grinding parameter is determined based on a first total thickness variation of the test wafer after being grinded, and the first total thickness variation of the test wafer is obtained by using a dedicated measuring device.

10. The method according to claim 9, wherein determining the updated grinding parameter comprises:

determining the updated grinding parameter based on the first total thickness variation of the test wafer from experimental data that is obtained in advance, wherein the experimental data comprises a correspondence between first total thickness variations of the test wafer after being grinded and grinding parameters.

11. The method according to claim 9, wherein whether the monitoring of the test wafer is required to be initiated is determined by:

determining whether the number of the to-be-thinned wafer reaches a mass production cycle, wherein in a case that the number of the to-be-thinned wafer reaches the mass production cycle, it is determined that the monitoring of the test wafer is required to be initiated.

12. The method according to claim 9, wherein the grinder is provided with a thickness measuring device;

the controlling a grinder to grind the to-be-thinned wafer with a set grinding parameter further comprises: acquiring, by using the thickness measuring device, a second total thickness variation of the to-be-thinned wafer after being grinded; and whether the monitoring of the test wafer is required to be initiated is determined based on the second total thickness variation of the to-be-thinned wafer.

13. The method according to claim 9, wherein a supporting stage of the grinder is provided with a first fixed point, a second lifting point and a third lifting point, and the grinding parameter comprises displacement parameters of the second lifting point and the third lifting point.

* * * * *